(12) United States Patent
Kim et al.

(10) Patent No.: US 9,799,718 B2
(45) Date of Patent: Oct. 24, 2017

(54) DISPLAY APPARATUS

(71) Applicant: Samsung Display Co., Ltd., Yongin-si, Gyeonggi-do (KR)

(72) Inventors: Hyuntae Kim, Yongin-si (KR); Ae Shin, Yongin-si (KR); Dongsoo Kim, Yongin-si (KR); Jingon Oh, Yongin-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 15/163,538

(22) Filed: May 24, 2016

(65) Prior Publication Data

US 2017/0077207 A1    Mar. 16, 2017

(30) Foreign Application Priority Data

Sep. 10, 2015    (KR) .................. 10-2015-0128562

(51) Int. Cl.
*H01L 29/49*    (2006.01)
*H01L 27/32*    (2006.01)
(Continued)

(52) U.S. Cl.
CPC ....... *H01L 27/3276* (2013.01); *G09G 3/3258* (2013.01); *H01L 27/3248* (2013.01); *H01L 27/3262* (2013.01); *H01L 27/3265* (2013.01); *H01L 27/124* (2013.01); *H01L 27/1255* (2013.01)

(58) Field of Classification Search
CPC ............ H01L 27/3276; H01L 27/3248; H01L 27/3262
See application file for complete search history.

(56) References Cited

U.S. PATENT DOCUMENTS

2012/0104399 A1    5/2012    Choi et al.
2014/0138644 A1*   5/2014    Park .................... H01L 27/3262
                                                              257/40

(Continued)

FOREIGN PATENT DOCUMENTS

JP          2003-223120 A     8/2003
KR     10-2006-0104220 A    10/2006
(Continued)

*Primary Examiner* — Michael Shingleton
(74) *Attorney, Agent, or Firm* — Knobbe Martens Olson & Bear LLP

(57) ABSTRACT

A display apparatus includes a plurality of pixels disposed over a substrate. Each pixel includes a scan line extending along a first direction, a data line extending along a second direction which is different from the first direction. Each pixel includes a switching thin film transistor connected to the scan line and the data line and including a switching gate electrode, a switching source electrode, and a switching drain electrode, a driving thin film transistor connected to the switching thin film transistor and including a driving gate electrode, a driving source electrode, and a driving drain electrode, and a storage capacitor connected to the driving thin film transistor and including a first capacitor electrode, a dielectric layer, and a second capacitor electrode which are sequentially stacked. Each of the first capacitor electrode and the second capacitor electrode is disposed on a different layer from those of the scan line and the data line.

20 Claims, 14 Drawing Sheets

(51) Int. Cl.
*G09G 3/3258* (2016.01)
*H01L 27/12* (2006.01)

(56) References Cited

U.S. PATENT DOCUMENTS

2014/0291636 A1   10/2014  Kim et al.
2016/0351643 A1*  12/2016  Xie ........................ H01L 21/77

FOREIGN PATENT DOCUMENTS

| KR | 10-0685831 B1 | 2/2007 |
| KR | 10-2008-0020308 A | 3/2008 |
| KR | 10-2010-0076603 A | 7/2010 |
| KR | 10-2012-0061009 A | 6/2012 |
| KR | 10-2012-0069457 A | 6/2012 |
| KR | 10-2013-0107459 A | 10/2013 |
| KR | 10-2014-0117041 A | 10/2014 |

* cited by examiner

DISPLAY APPARATUS

CROSS-REFERENCE TO RELATED APPLICATION

This application claims the benefit of Korean Patent Application No. 10-2015-0128562, filed on Sep. 10, 2015, in the Korean Intellectual Property Office, the disclosure of which is incorporated herein in its entirety by reference.

BACKGROUND

1. Field

The present disclosure relates to a display apparatus.

2. Discussion of the Related Technology

An organic light-emitting display apparatus includes two electrodes and an organic light-emitting layer disposed between the two electrodes, and emits light when electrons injected into one electrode and holes injected into the other electrode combine in the organic light-emitting layer to generate excitons and when the generated excitons emit energy.

The organic light-emitting display apparatus includes a plurality of pixels including an organic light-emitting diode which is a self-luminous element, and each pixel includes a plurality of thin film transistors and one or more storage capacitors to drive the organic light-emitting diode. As demands for an ultra-high resolution product increase, it is difficult to provide enough space to form the storage capacitor in the display apparatus.

SUMMARY

One or more embodiments include a display apparatus.

Additional aspects will be set forth in part in the description which follows and, in part, will be apparent from the description, or may be learned by practice of the presented embodiments.

One aspect of the invention provides a display apparatus, which comprises: a plurality of pixels disposed over a substrate, wherein each pixel may comprise: a scan line extending along a first direction; a data line extending along a second direction which is different from the first direction; a switching thin film transistor connected to the scan line and the data line, the switching thin film transistor comprising a switching gate electrode, a switching source electrode, and a switching drain electrode; a driving thin film transistor connected to the switching thin film transistor, the driving thin film transistor comprising a driving gate electrode, a driving source electrode, and a driving drain electrode; and a storage capacitor connected to the driving thin film transistor, the storage capacitor comprising a first capacitor electrode, a dielectric layer, and a second capacitor electrode which are sequentially stacked, wherein each of the first capacitor electrode and the second capacitor electrode is disposed on a different layer from those of the scan line and the data line.

The foregoing apparatus may further comprise a driving voltage line extending along the second direction and disposed on a layer different from that of the data line. The driving voltage line may be disposed on the same layer as that of the second capacitor electrode. The second capacitor electrode may be a portion of the driving voltage line. The driving voltage line may comprise a first portion extending along the second direction and a second portion extending along the first direction which intersects the first portion. The driving voltage line may be disposed on a layer below that of the data line. The driving gate electrode may be disposed on the same layer as that of the scan line and apart from the scan line to have an island shape when viewed in a direction perpendicular to a major surface of the substrate.

Still in the foregoing apparatus, the first capacitor electrode may be disposed on a different layer from that of the driving gate electrode. The first capacitor electrode may be connected to the switching thin film transistor through a first contact hole and is further connected to the driving gate electrode through a second contact hole. The second capacitor electrode is disposed on a layer below that of the data line. The first capacitor electrode and the second capacitor electrode may be disposed on a layer between those of the scan line and the data line.

Further in the foregoing apparatus, the apparatus may further comprise: a pixel electrode connected to the switching thin film transistor; and a first connecting electrode disposed between the switching thin film transistor and the pixel electrode. The first connecting electrode may be disposed on the same layer as that of the data line. The apparatus may further comprise a first intermediate electrode layer disposed between the switching thin film transistor and the first connecting electrode. The first intermediate electrode layer may be disposed on the same layer as that of the first capacitor electrode. The first connecting electrode may connected to the first intermediate electrode layer through a contact hole and is further connected to the pixel electrode through a via hole, wherein the contact hole and the via hole are separate from each other.

Another aspect of the invention provides a display apparatus, which comprises: a plurality of pixels disposed over a substrate, wherein each pixel may comprise: a scan line extending along a first direction; a data line extending along a second direction which is different from the first direction; a driving voltage line disposed along the second direction; a switching thin film transistor comprising a switching gate electrode, a switching source electrode, and a switching drain electrode; a driving thin film transistor comprising a driving gate electrode, a driving source electrode, and a driving drain electrode; and a storage capacitor connected to the driving thin film transistor, the storage capacitor comprising a first capacitor electrode, a dielectric layer, and a second capacitor electrode which are sequentially stacked, and wherein the driving voltage line and the data line are disposed on different layers.

In the foregoing apparatus, the driving voltage line may comprise a first portion extending along the second direction, and a second portion extending along the first direction which intersects the second direction. A portion of the second portion may overlap the data line when viewed in a direction perpendicular to a major surface of the substrate. A portion of the second portion may be the second capacitor electrode of the storage capacitor.

According to one or more embodiments, a display apparatus may include a plurality of pixels disposed on a substrate, and the pixel may include a scan line that extends along a first direction, a data line that extends along a second direction which is different from the first direction, a switching thin film transistor connected to the scan line and the data line and including a switching gate electrode, a switching source electrode, and a switching drain electrode, a driving thin film transistor connected to the switching thin film transistor and including a driving gate electrode, a driving source electrode, and a driving drain electrode, and a storage capacitor connected to the driving thin film transistor and including a first capacitor electrode, a dielectric layer, and a second capacitor electrode which are sequentially stacked, wherein the first capacitor electrode and the second capacitor electrode may be disposed on a different layer from the scan line and the data line.

According to one or more embodiments, the display apparatus may further include a driving voltage line that extends along the second direction and disposed on a layer different from the data line.

According to one or more embodiments, the driving voltage line may be disposed on the same layer as the second capacitor electrode.

According to one or more embodiments, a portion of the driving voltage line may form the second capacitor electrode.

According to one or more embodiments, the driving voltage line may include a first portion disposed along the second direction and a second portion disposed along the first direction which intersects the first portion.

According to one or more embodiments, the driving voltage line may be disposed below the data line.

According to one or more embodiments, the driving gate electrode may be an island type and is disposed on a same layer as the scan line.

According to one or more embodiments, the first capacitor electrode may be disposed on a different layer from that of the driving gate electrode.

According to one or more embodiments, the first capacitor electrode may be connected to the switching thin film transistor through a first contact hole and may be connected to the driving gate electrode through a second contact hole.

According to one or more embodiments, the second capacitor electrode may be disposed below the data line.

According to one or more embodiments, the first capacitor electrode and the second capacitor electrode may be disposed between the scan line and the data line.

According to one or more embodiments, the display apparatus may further include a pixel electrode connected to the switching thin film transistor, and a first connecting electrode disposed between the switching thin film transistor and the pixel electrode.

According to one or more embodiments, the first connecting electrode may be disposed on a same layer as the data line.

According to one or more embodiments, the display apparatus may further include a first intermediate electrode layer disposed between the switching thin film transistor and the first connecting electrode.

According to one or more embodiments, the first intermediate electrode layer may be disposed on a same layer as the first capacitor electrode.

According to one or more embodiments, the first connecting electrode may be connected to the first intermediate electrode layer through a contact hole and may be connected to the pixel electrode through a via hole, and the contact hole and the via hole may be spaced apart from each other.

According to one or more embodiments, a display apparatus may include a plurality of pixels disposed on a substrate, and the pixel may include a scan line that extends along a first direction, a data line that extends along a second direction which is different from the first direction, a driving voltage line disposed along the second direction, a switching thin film transistor including a switching gate electrode, a switching source electrode, and a switching drain electrode, a driving thin film transistor including a driving gate electrode, a driving source electrode, and a driving drain electrode, and a storage capacitor connected to the driving thin film transistor and including a first capacitor electrode, a dielectric layer, and a second capacitor electrode which are sequentially stacked, wherein the driving voltage line and the data line may be disposed on different layers.

According to one or more embodiments, the driving voltage line may include a first portion extended along the second direction, and a second portion extended along the first direction which intersects the second direction.

According to one or more embodiments, a portion of the second portion may overlap the data line.

According to one or more embodiments, a portion of the second portion may be the second capacitor electrode of the storage capacitor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
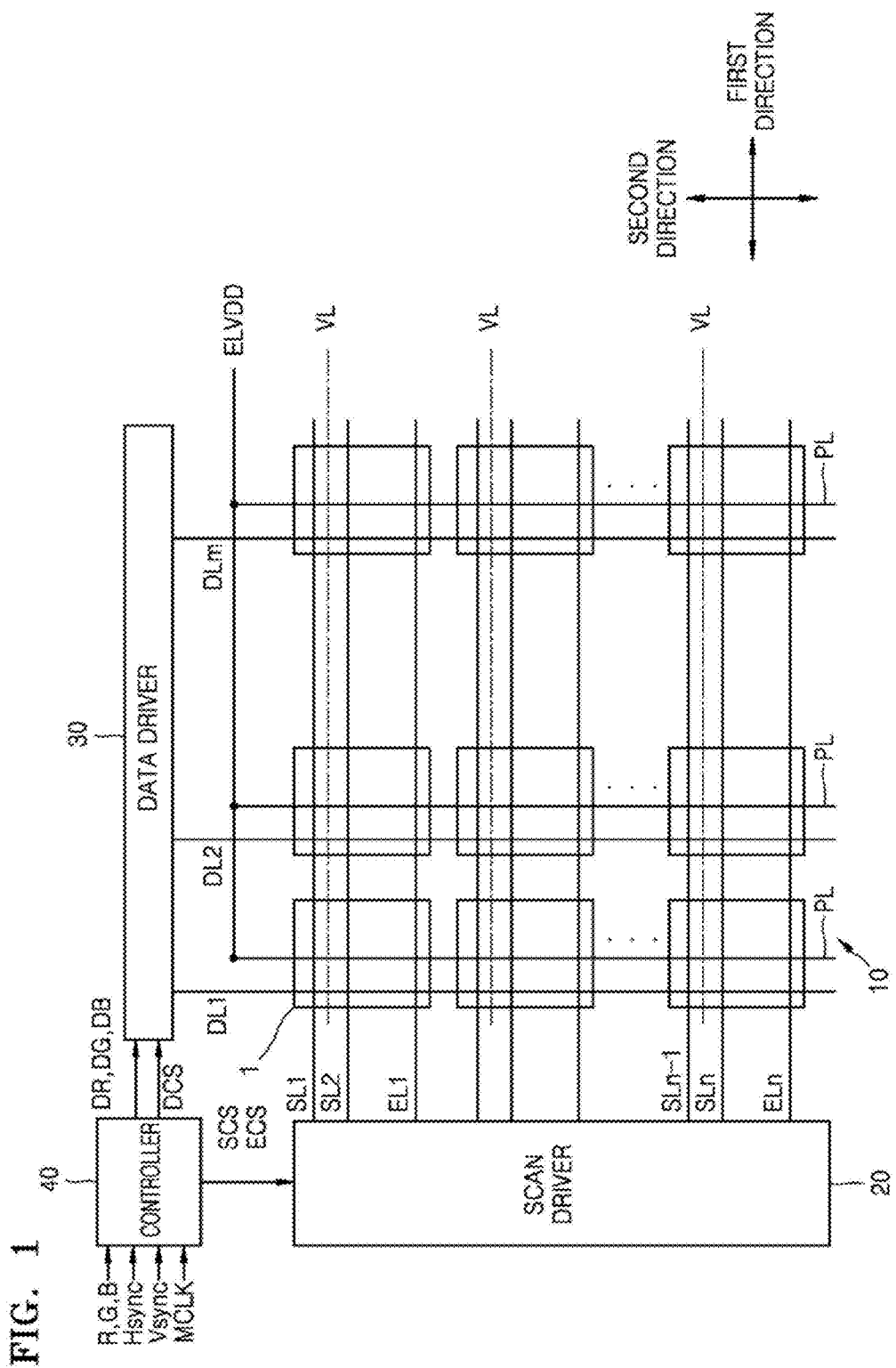
FIG. 1 is a block diagram schematically illustrating a display apparatus according to one embodiment of the present inventive concept.

The present embodiments may have different forms and should not be construed as being limited to the descriptions set forth herein. Accordingly, the embodiments are merely described below, by referring to the figures, to explain aspects of the present description.

Reference will now be made in detail to embodiments, examples of which are illustrated in the accompanying drawings, wherein like reference numerals refer to like elements throughout.

It will be understood that although the terms "first", "second", etc. may be used herein to describe various components, these components should not be limited by these terms. These components are only used to distinguish one component from another component.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being formed or disposed "on" another layer, region, or component, it can be formed or disposed directly on and contact the other layer, region, or component, or it can be formed or disposed indirectly on the other layer, region or component such that one or more intervening layers, regions, or components may be present therebetween.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In embodiments, when a film, layer, region and component are connected to each other, "connection" may include a direct connection between the film, layer, region, and component and also include an indirectly connection between the film, layer, region, and component through another the film, layer, region, or component. For example, when the present disclosure states that a film, layer, region, and component is electrically connected to each other, the connection may include not only a direct connection between the film, layer, region, and component but also an indirect connection between the film, layer, region, and component though another film, layer, region, or component.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram schematically illustrating a display apparatus according to one embodiment of the present inventive concept.

The display apparatus according to one embodiment of the present inventive concept includes a display unit 10 including a plurality of pixels 1, a scan driver 20, a data driver 30, and a control unit 40.

The display unit 10 includes the plurality of pixels 1 disposed at intersections of a plurality of scan lines SL1 through SLn, a plurality of data lines DL1 through DLm, and a plurality of light emission control lines EL1 through ELk and arranged in a matrix form. The plurality of scan lines SL1 through SLn and the plurality of light emission lines EL1 through ELk extend along a first direction which is a row direction, and the plurality of data lines DL1 through DLm and a plurality of driving voltage lines PL extend along a second direction which is a column direction.

Each pixel 1 is connected to two scan lines among the plurality of scan lines SL1 through SLn which are connected to the display unit 10 from the scan driver 20. Although FIG. 1 illustrates that one scan line corresponding to a pixel line and another scan line corresponding to a scan line of a previous pixel line are connected to the pixel 1, the present inventive concept is not limited thereto.

Each pixel 1 is connected to one data line among the plurality of data lines DL1 through DLm and one light emission control line among the plurality of light emission control lines EL1 through ELk. In addition, each pixel 1 is connected to one initializing voltage line among the plurality of initializing voltage lines VL and one of the plurality of driving voltage lines PL which supply a first power voltage ELVDD to the pixel 1. According to one embodiment, two adjacent pixels 1 among the plurality of pixels 1 may share the initializing voltage lines VL.

The scan driver 20 transmits scan signals respectively corresponding to the pixels 1 through the plurality of scan lines SL1 through SLn. In embodiments, the scan driver 20 transmits a first scan signal through a scan line corresponding to a row line, which is included in each pixel 1, and also transmits a second scan signal through a scan line corresponding to a previous row line. For example, the scan driver 20 transmits a first scan signal Sn to the pixel 1, which is disposed on an $n^{th}$ column line and an $m^{th}$ row line, through an nth scan line SLn and also transmits a second scan signal Sn-1 to the same pixel 1 through an $n-1^{th}$ scan line SLn-1. Also, the scan driver 20 generates and transmits light emission control signals to the pixels 1 through the plurality of light emission control lines EL1 through ELk, respectively.

Although the present embodiment illustrates that scan signals and light emission control signals are generated from the scan driver 20, the present inventive concept is not limited thereto. According to another embodiment, an organic light-emitting display apparatus may further include a light emission control unit, and a light emission control signal may be generated from the light emission control unit.

The data driver 30 transmits data signals to the pixels 1 through the plurality of data lines SL1 through SLm.

The control unit 40 converts a plurality of image signals R, G, B, which are transmitted from outside, into a plurality of image data signals DR, DG, and DB, and transmits the generated image data signals DR, DG, and DB to the data driver 30. In addition, the control unit 40 receives a vertical synchronization signal Vsync, a horizontal synchronization signal Hsync, and a clock signal MCLK, generates control signals to control the scan driver 20 and the data driver 30, and transmits the control signals to corresponding ones of the scan driver 20 and the data driver 30. In embodiments, the control unit 40 generates and transmits a scan driving control signal SCS and a light emission driving control signal ECS to control the scan driver 20, and also generates and transmits a data driving control signal DCS to control the data driver 30.

The respective pixels 1 receive a first power voltage ELVDD and a second power voltage ELVSS from outside. The first power voltage ELVDD may be a high level voltage, and the second power voltage ELVSS may be a voltage lower than the first power voltage ELVDD or a ground voltage.

The respective pixels 1 emit light according to a driving current Id which is supplied from an organic light-emitting diode OLED according to the data signals D1 through Dm transmitted through the plurality of data lines DL1 through DLm.

Figure 2:
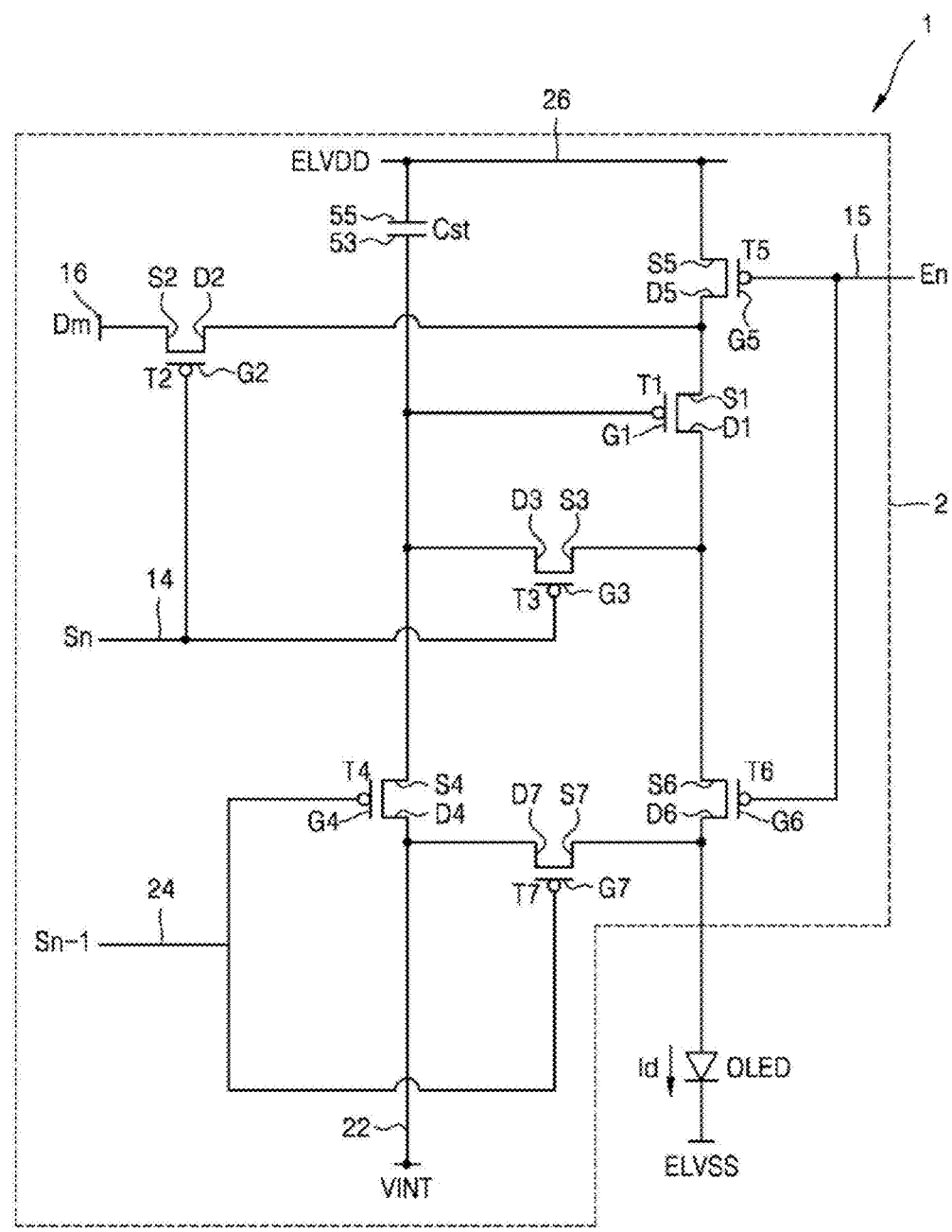
FIG. 2 is an equivalent circuit diagram of an organic light-emitting display apparatus according to one embodiment of the present inventive concept.

FIG. 2 is an equivalent circuit diagram of an organic light-emitting display apparatus according to one embodiment of the present inventive concept.

One pixel 1 includes a pixel circuit 2 having a plurality of thin film transistors T1 through T7 and a storage capacitor Cst. In addition, the pixel 1 includes the organic light-emitting diode OLED which receives a driving voltage Id from the pixel circuit 2 and emits light.

The plurality of thin film transistors T1 through T7 include a driving thin film transistor T1 and a plurality of switching transistors T2 through T7. The switching transistors T2 through T7 are referred to as a data transmitting thin film transistor T2, a compensating thin film transistor T3, a first initializing thin film transistor T4, a first light emission control thin film transistor T5, a second light emission control thin film transistor T6, and a second initializing thin film transistor T7.

The pixel 1 includes a first scan line 14 to transmit a first scan signal Sn to the data transmitting thin film transistor T2 and the compensating thin film transistor T3, a second scan line 24 to transmit a second scan signal Sn−1 to the first initializing thin film transistor T4 and the second initializing thin film transistor T7, a light emission control line 15 to transmit a light emission control signal En to the first light emission control thin film transistor T5 and the second light emission control thin film transistor T6, a data line 16 to transmit a data signal DM, a driving voltage line 26 to transmit a first driving power voltage ELVDD, and an initializing voltage line 22 to transmit an initializing voltage VINT for initialization of the driving thin film transistor T1.

A driving gate electrode G1 of the driving thin film transistor T1 is connected to a first capacitor electrode 53 of the storage capacitor Cst. A driving source electrode S1 of the driving thin film transistor T1 is connected to the driving voltage line 26 through the first light emission control thin film transistor T5. A driving drain electrode D1 of the driving thin film transistor T1 is connected to an anode of a pixel electrode through the second light emission control thin film transistor T6. The driving thin film transistor T1 receives the data signal Dm according to a switching operation of the data transmitting thin film transistor T2 and supplies the driving current Id to the organic light-emitting diode OLED.

A data transmitting gate electrode G2 of the data transmitting thin film transistor T2 is connected to the first scan line 14. A data transmitting source electrode S2 of the data transmitting thin film transistor T2 is connected to the data line 16. A data transmitting drain electrode D2 of the data transmitting thin film transistor T2 is connected to the driving source electrode S1 of the driving thin film transistor T1 and the driving voltage line 26 through the first light emission control thin film transistor T5. The data transmitting thin film transistor T2 receives the first scan signal Sn, is turned on according to the received first scan signal Sn, and performs a switching operation to transmit the data signal Dm to the driving source electrode S1 of the driving thin film transistor T1.

A compensating gate electrode G3 of the compensating thin film transistor T3 is connected to the first scan line 14. A compensating source electrode S3 of the compensating thin film transistor T3 is connected to the driving drain electrode D1 of the driving thin film transistor T1 and the anode of the organic light-emitting diode OLED through the second light emission control thin film transistor T6. A compensating drain electrode D3 of the compensating thin film transistor T3 is connected to the first capacitor electrode 53 of the storage capacitor Cst, the first initializing source electrode S4 of the first initializing thin film transistor T4, and the driving gate electrode G1 of the driving thin film transistor T1. The compensating thin film transistor T3 receives the first scan signal Sn from the first scan line 14, is turned on according to the received first scan signal Sn, and performs a diode-connection of the driving thin film transistor T1 to connect the driving gate electrode G1 to the driving drain electrode D1.

A first initializing gate electrode G4 of the first initializing thin film transistor T4 is connected to the second scan line 24. A first initializing drain electrode D4 of the first initializing thin film transistor T4 is connected to the initializing voltage line 22. A first initializing source electrode S4 of the first initializing thin film transistor T4 is connected to the first capacitor electrode 53 of the storage capacitor Cst, the compensating drain electrode D3 of the compensating thin film transistor T3, and the driving gate electrode G1 of the driving thin film transistor T1. The first initializing thin film transistor T4 receives the second scan signal Sn−1 from the second scan line 24, is turned on according to the received second scan signal Sn−1, and transmits the initializing voltage VINT to the driving gate electrode G1 of the driving thin film transistor T1 to initialize the driving gate electrode G1 of the driving thin film transistor T1.

A first light emission control gate electrode G5 of the first light emission control thin film transistor T5 is connected to the light emission control line 15. A first light emission control source electrode S5 of the first light emission control thin film transistor T5 is connected to the driving voltage line 26. A first light emission control drain electrode D5 of the first light emission control thin film transistor T5 is connected to the driving source electrode S1 of the driving thin film transistor T1 and the data transmitting drain electrode D2 of the data transmitting thin film transistor T2.

A second light emission control gate electrode G6 of the second light emission control thin film transistor T6 is connected to the light emission control line 15. A second light emission control source electrode S6 of the second light emission control thin film transistor T6 is connected to the driving drain electrode D1 of the driving thin film transistor T1 and the compensating source electrode S3 of the compensating thin film transistor T3. A second light emission control drain electrode D6 of the second light emission control thin film transistor T6 is electrically connected to the anode of the inorganic light-emitting diode OLED. The first light emission control thin film transistor T5 and the second light emission control thin film transistor T6 receive the light emission control signal En through the light emission control line 15, are turned on according to the received light emission control signal En, and transmit the first power voltage ELVDD to the organic light-emitting diode OLED so that the driving current Id flows through the organic light-emitting diode OLED.

A second initializing gate electrode G7 of the second initializing thin film transistor T7 is connected to the second scan line 24. A second initializing source electrode S7 of the second initializing thin film transistor T7 is connected to the anode of the organic light-emitting diode OLED. A second initializing drain electrode D7 of the second initializing thin film transistor T7 is connected to the initializing voltage line 22. The second initializing thin film transistor T7 receives the second scan signal Sn−1 through the second scan line 24, is turned on according to the received second scan signal Sn−1, and initializes the anode of the organic light-emitting diode OLED.

Although the present embodiment illustrates that the first initializing thin film transistor T4 and the second initializing thin film transistor T7 are connected to the second scan line 24, the present inventive concept is not limited thereto. According to another embodiment, the first initializing thin film transistor T4 may be connected to the second scan line 24 and driven by the second scan signal Sn−1, and the second initializing thin film transistor T7 may be connected to a third scan line and driven by a third scan signal Sn+1.

A second capacitor electrode 55 of the storage capacitor Cst is connected to the driving voltage line 26. The first capacitor electrode 53 of the storage capacitor Cst is connected to the driving gate electrode G1 of the driving thin film transistor T1, the compensating drain electrode D3 of the compensating thin film transistor T3, and the first initializing source electrode S4 of the first initializing thin film transistor T4.

A cathode of the organic light-emitting diode OLED is connected to a second power voltage ELVSS. The organic light-emitting diode OLED receives the driving current Id from the driving thin film transistor T1 and displays an image by emitting light according to the received driving current Id.

Figure 3:
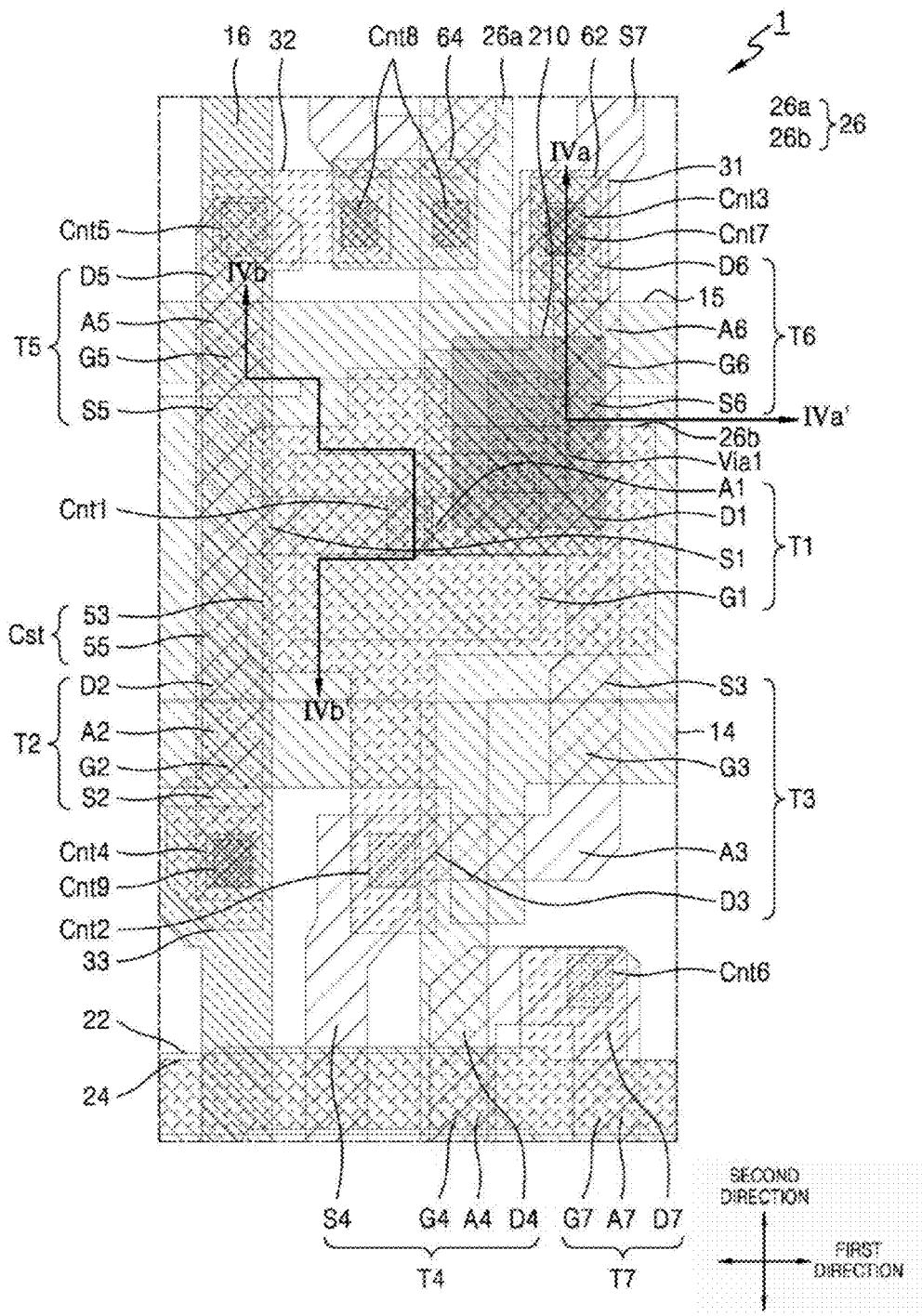
FIG. 3 is a schematic plan view illustrating a pixel of a display apparatus according to one embodiment of the present inventive concept.
Figure 4:
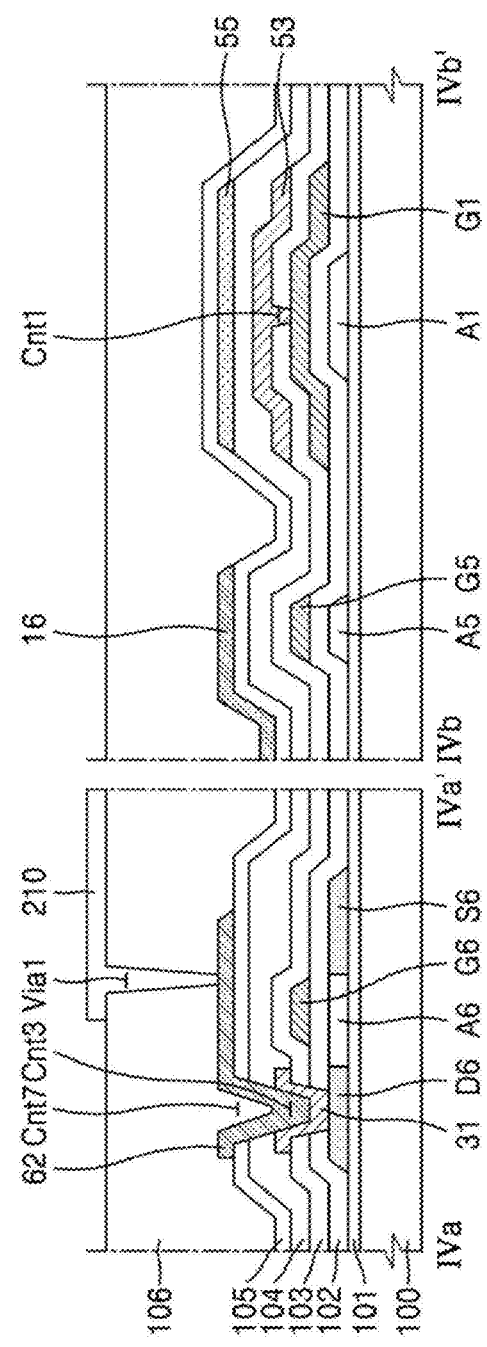
FIG. 4 is a cross-sectional view taken along lines VIa-VIa' and VIb-VIb' of FIG. 3.

FIG. 3 is a schematic plan view illustrating the pixel 1 of the display apparatus according to one embodiment of the present inventive concept, and FIG. 4 is a cross-sectional view taken along lines VIa-VIa' and VIb-VIb' of FIG. 3.

Referring to FIGS. 3 and 4, the pixel 1 may include a plurality of lines, for example, lines 14, 15, 16, 22, 24, and 26, the driving thin film transistor T1, the plurality of switching thin film transistors T2 through T7, the storage capacitor Cst, and a pixel electrode 210.

The lines 14, 16, 22, 24, and 26 may be referred to as the first and second scan lines 14 and 24 and the initializing voltage line 22, which extend along a first direction, and the data line 16 and the driving voltage line 26, which intersect the first and second scan lines 14 and 24 and extend along a second direction. The first and second scan lines 14 and 24 may be disposed on the same layer as the gate electrodes G1 through G7 of the plurality of thin film transistors T1 through T7, and the initializing voltage line 22 may be disposed on the same layer as the first capacitor electrode 53 of the storage capacitor Cst. In embodiments, the scan lines 14 and 24 and the gate electrodes G1 through G7 may be disposed between two immediately neighboring insulation layers 102 and 103 such that they are disposed on the same layer.

The driving voltage line 26 extends along the second direction and includes a first portion 26a which is disposed on a different layer from the data line 16. In one embodiment, the first portion 26a of the driving voltage line 26 may be disposed below the data line 16. In embodiments, one or more intervening insulation layers may be disposed between the driving voltage line 26 and the data line 16.

A portion of the driving voltage line 26 is formed as the second capacitor electrode 55 of the storage capacitor Cst. For example, the driving voltage line 26 may be a second portion 26b which intersects the first portion 26a of the driving voltage line 26 and extends along the first direction. The second portion 26b of the driving voltage line 26 may be formed as the second capacitor electrode 55 of the storage capacitor Cst. The second portion 26b of the driving voltage line 26 may be formed as an integrated body with the first portion 26a of the driving voltage line 26.

The driving voltage line 26 and the data line 16 may be disposed on different layers to increase an area of the storage capacitor Cst. In addition, the driving voltage line 26 blocks lines/electrodes, which are disposed above the driving voltage line 26, and lines/electrodes, which are disposed below the driving voltage line 26. The driving voltage line 26 prevents a coupling between the lines and electrodes, and also prevents crosstalk between the lines and electrodes. For example, the driving voltage line 26 may prevent the coupling between the data line 16, which is disposed above the driving voltage line 26, and the first scan line 14 and the first capacitor electrode 53 of the storage capacitor Cst, which are disposed below the driving voltage line 26.

A buffer layer 101 is disposed on a substrate 100, and semiconductor layers are formed above the substrate 100. The cross-sectional view taken along the line VIa-VIa' of FIG. 3 illustrates the second light emission control electrode S6, the second light emission control drain electrode D6, and a second light emission control semiconductor layer A6, and the cross-sectional view taken along the line VIb-VIb' of FIG. 3 illustrates a driving semiconductor layer A1.

A first conductive layer including a gate insulation film 102, the second light emission control gate electrode G6, and the driving gate electrode G1, a second conductive layer including a second gate insulation film 103, the first capacitor electrode 53 of the storage capacitor Cst, and a first intermediate electrode layer 31, a third conductive layer including a first interlayer insulation film 104 and the second capacitor electrode 55 of the storage capacitor Cst, a fourth conductive layer including a second interlayer insulation film 105, the data line 16, and a first connecting electrode 62, and a planarization film 106 are sequentially formed on the semiconductor layers. The first gate insulation film 102, the second gate insulation film 103, the first interlayer insulation film 104, the second interlayer insulation film 105, and the planarization film 106 have an insulation characteristic and may include an inorganic compound and/or organic compound.

The storage capacitor Cst may include the first capacitor electrode 53, a dielectric layer, and the second capacitor electrode 55. The dielectric layer may be formed as a portion of the first interlayer insulation film 104 which is disposed between the first capacitor electrode 53 and the second capacitor electrode 55. Each of the first capacitor electrode 53 and the second capacitor electrode 55 of the storage capacitor Cst may be disposed on a different layer from the first and second scan lines 14 and 24 and the data line 16. For example, the first capacitor electrode 53 may be disposed between the first and second scan lines 14 and 24 and the data line 16, and the second capacitor electrode 55 may be disposed below the data line 16.

In embodiments, one or more intervening insulation layers may be disposed between the first capacitor electrode 53 and any one of the first scan line 14, the second scan line 24 and the data line 16. In an embodiment, the first capacitor electrode 53 is disposed between a pair of two immediately neighboring insulation layers 103 and 104, while the first and second scan lines 14 and 24 are disposed between another pair of two immediately neighboring insulation layers 102 and 103. The first capacitor electrode 53 may or may not overlap the first and second scan lines 14 and 24 when viewed in a viewing direction perpendicular to a major surface of the substrate. In embodiments, one or more intervening insulation layers may be disposed between the second capacitor electrode 55 and any one of the first scan line 14, the second scan line 24 and the data line 16. In an embodiment, the second capacitor electrode 55 is disposed between a pair of two immediately neighboring insulation layers 104 and 105, while the data line 16 is disposed between another pair of two immediately neighboring insulation layers 105 and 106. The electrode 55 may or may not overlap the data line 16 when viewed in the viewing direction.

The first capacitor electrode 53 of the storage capacitor Cst is connected to the diving gate electrode G1 through a first contact hole Cnt1. The first capacitor electrode 53 of the storage capacitor Cst may be disposed to overlap with the driving semiconductor layer A1. A portion of the first capacitor electrode 53 may be extended along the first direction, and is connected to the first initializing thin film transistor T4 through a second contact hole which is formed in the extended portion of the first capacitor electrode 53.

The second capacitor electrode 55 of the storage capacitor Cst may have at least a portion to overlap with the first capacitor electrode 53 of the storage capacitor Cst. For example, the second capacitor electrode 55 of the storage capacitor Cst may be disposed to cover the entire first capacitor electrode 53 of the storage capacitor Cst. As stated above, the second capacitor electrode 55 of the storage capacitor Cst may be disposed on the same layer as the driving voltage line 26. In embodiments, the second capacitor electrode 55 and the driving voltage line 26 may be disposed between two immediately neighboring insulation layers 104 and 105 such that they are disposed on the same layer. The second capacitor electrode 55 of the storage capacitor Cst may be formed as a portion of the driving voltage line 26.

The first and second capacitor electrodes 53 and 55 of the storage capacitor Cst may be disposed on a different layer from the first and second scan lines 14 and 24 and the data line 16. For example, the first and second capacitor electrodes 53 and 55 of the storage capacitor Cst may be disposed between the first and second scan lines 14 and 24 and the data line 16.

The second capacitor electrode 55 of the storage capacitor Cst may be disposed to overlap the first capacitor electrode 53 through the first interlayer insulation film 104 and may be disposed above the first capacitor electrode 53. The first capacitor electrode 53 of the storage capacitor Cst may be disposed to overlap the driving gate electrode G1 through the second gate insulation film 103 and may be disposed above the driving gate electrode G1. Here, since the driving gate electrode G1 is electrically connected to the first capacitor electrode 53 of the storage capacitor Cst through the first contact hole Cnt1, the driving gate electrode G1 and the first capacitor electrode 53 may have the same potential.

If the data line 16, the driving voltage line 26, and the second capacitor electrode 55 of the storage capacitor Cst are disposed on the same layer, the data line 16 and the second capacitor electrode 55 should be spaced apart from each other by a distance. In this case, the second capacitor electrode 55 has a limited area, and it is difficult to realize ultra-high resolution because of the limited area of the storage capacitor Cst and a non-secure capacitance of the storage capacitor Cst. However, in the present embodiment, the data line 16, the driving voltage line 26, and the second capacitor electrode 55 of the storage capacitor Cst are disposed on different layers so that ultra-high resolution is realized because of an increased area of the second capacitor electrode 55 and a secure capacitance of the storage capacitor Cst.

The driving thin film transistor T1 includes the driving semiconductor layer A1, the driving gate electrode G1, the driving source electrode S1, and the driving drain electrode D1. The driving source electrode S1 corresponds to a driving source area doped with impurities in the driving semiconductor layer A1, and the driving drain electrode D1 corresponds to a driving drain area doped with impurities in the driving semiconductor layer A1. The driving source area and the driving drain area correspond to a driving channel area in the driving semiconductor layer A1. The driving gate electrode G1 is connected to the storage capacitor Cst, the compensating drain electrode D3 of the compensating thin film transistor T3, and the first initializing source electrode S4 of the first initializing thin film transistor T4. For example, the driving gate electrode G1 is electrically connected to the first capacitor electrode 53 of the storage capacitor Cst through the first contact hole Cnt1. The driving gate electrode G1 is an island type and may be disposed on the same layer as the first and second scan lines 14 and 24.

The data transmitting thin film transistor T2 includes a data transmitting semiconductor layer A2, the data transmitting gate electrode G2, the data transmitting source electrode S2, and the data transmitting drain electrode D2. The data transmitting source electrode S2 corresponds to a switching source area doped with impurities in the data transmitting semiconductor layer A2, and the data transmitting drain electrode D2 corresponds to a data transmitting drain area doped with impurities in the data transmitting semiconductor layer A2. The data transmitting source electrode S2 is connected to the data line 16 through a ninth contact hole Cnt9. In another embodiment, the data transmitting source electrode S2 forms a cover metal in a fourth contact hole Cnt4 and is electrically connected to the data line 16 through the ninth contact hole Cnt9. The data T5 transmitting drain electrode D2 is connected to the driving thin film transistor T1 and the first light emission control thin film transistor T5. The data transmitting gate electrode G2 is formed as a portion of the first scan line 14.

The compensating thin film transistor T3 includes a compensating semiconductor layer A3, the compensating gate electrode G3, the compensating source electrode S3, and the compensating drain electrode D3. The compensating source electrode S3 corresponds to a compensating source area doped with impurities in the compensating semiconductor layer A3, and the compensating drain electrode D3 corresponds to a compensating drain area doped with impurities in the compensating semiconductor layer A3. The compensating gate electrode G3 forms a dual gate electrode including a portion of the first scan line 14 and a portion of protrusions of the first scan line 14 and a portion of a line, which protrudes from the first scan line 14 and extends therefrom, and blocks a leakage current thereof.

The first initializing thin film transistor T4 includes a first initializing semiconductor layer A4, the first initializing gate electrode G4, the first initializing source electrode S4, and the first initializing drain electrode D4. The first initializing source electrode S4 corresponds to a first initializing source area doped with impurities in the first initializing semiconductor layer A4, and the first initializing drain electrode D4 corresponds to a first initializing drain area doped with impurities in the first initializing semiconductor layer A4. The first initializing drain electrode D4 is connected to the second initializing thin film transistor T7, and the first initializing source electrode S4 is connected to the driving gate electrode G1 through the first capacitor electrode 53 of the storage capacitor Cst. The first initializing gate electrode G4 may be formed as a portion of the second scan line 24.

The first light emission control thin film transistor T5 includes a first light emission control semiconductor layer A5, the first light emission control gate electrode G5, the first light emission control source electrode S5, and the first light emission control drain electrode D5. The first light emission control source electrode S5 corresponds to a first light emission control source area doped with impurities in the first light emission control semiconductor layer A5, and the first light emission control drain electrode D5 corresponds to a first light emission control drain area doped with impurities in the first light emission control semiconductor layer A5. The first light emission control source electrode S5 is connected to a second intermediate electrode layer 32 through a fifth contact hole Cnt5, and a second connecting electrode 64 is electrically connected to the second intermediate electrode layer 32 and the driving voltage line 26 through an eighth contact hole Cnt8. For example, the first light emission control source electrode S5 may be connected to the driving voltage line 26 through the second intermediate electrode 32 and the second connecting electrode 64. The first light emission control gate electrode G5 is formed as a portion of the light emission control line 15.

The second light emission control thin film transistor T6 includes a second light emission control semiconductor layer A6, the second light emission control gate electrode G6, the second light emission control source electrode S6, and the second light emission control drain electrode D6. The second light emission control source electrode S6 corresponds to a second light emission control source area doped with impurities in the second light emission control semiconductor layer A6, and the second light emission control drain electrode D6 corresponds to a second light emission control drain area doped with impurities in the second light emission control semiconductor layer A6. The second light emission control drain electrode D6 is connected to the first connecting electrode 62 and the second intermediate electrode layer 32 through third and seventh contact holes Cnt3 and Cnt7, respectively, and the first connecting electrode 62 is electrically connected to the pixel electrode 210 of the organic light-emitting diode OLED through a first via hole Via1. The second light emission control gate electrode G6 is formed as a portion of the light emission control line 15.

The second initializing thin film transistor T7 includes a second initializing semiconductor layer A7, the second initializing gate electrode G7, the second initializing source electrode S7, and the second initializing drain electrode D7. The second initializing source electrode S7 corresponds to a second initializing source area doped with impurities in the second initializing semiconductor layer A7, and the second initializing drain electrode D7 corresponds to a second initializing drain area doped with impurities in the second initializing semiconductor layer A7. The second initializing drain electrode D7 is connected to the initializing voltage line 22 through a sixth contact hole Cnt6. The second initializing source electrode S7 is connected to the pixel electrode 210 of the organic light-emitting diode OLED through the first connecting electrode 62 and the first intermediate electrode layer 31.

The pixel electrode 210 is formed to overlap the driving thin film transistor T1 and at least a portion of the second light emission control thin film transistor T6 through the first via hole Via1.

The pixel electrode 210 may be connected to the second light emission control thin film transistor T6 through the first connecting electrode 62. The first connecting electrode 62 may be disposed on the same layer as the data line 16 and may include the same material as the data line 16. In embodiments, the first connecting electrode 62 and the data line 16 may be disposed between two immediately neighboring insulation layers 105 and 106 such that they are disposed on the same layer. Further, the data line 16 and the first connecting electrode 62 may be formed patterning an electrically conductive material layer. The first connecting electrode 62 is connected to the pixel electrode 210 through the first via hole Via1, which is spaced apart from the seventh contact hole Cnt7. It is possible that the first via hole Via1 is formed in an area where the first via hole Via1 and the seventh contact hole Cnt7 overlap each other. However, it is difficult to form a via hole since an area of the pixel 1 becomes narrow in the ultra-high resolution display apparatus. Accordingly, the first via hole Via1 is formed in an area corresponding to an extended portion of the first connecting electrode 62 and is spaced apart from the seventh contact hole Cnt7.

Although FIGS. 3 and 4 illustrate that the driving voltage line 26 is disposed below the data line 16, the present inventive concept is not limited thereto. In another embodiment, the driving voltage line 26 is disposed above the data line 26.

Figure 5:
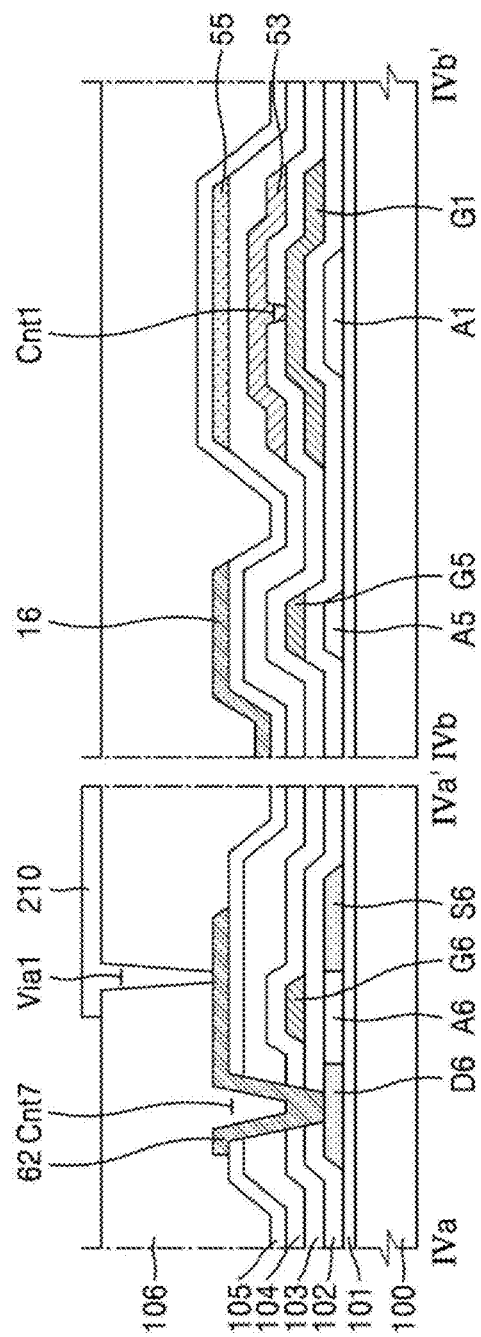
FIG. 5 is a cross-sectional view illustrating a display apparatus according to one embodiment of the present inventive concept.

FIG. 5 is a cross-sectional view illustrating a display apparatus according to one embodiment of the present inventive concept.

Referring to FIG. 5, the first intermediate electrode layer 31 may not be disposed between the first connecting electrode 62 and the second light emission control drain electrode D6 of the second light emission control thin film transistor T6.

FIGS. 6 through 14 are views illustrating a method of forming a pixel of a display apparatus according to one embodiment of the present inventive concept.

Figure 6:
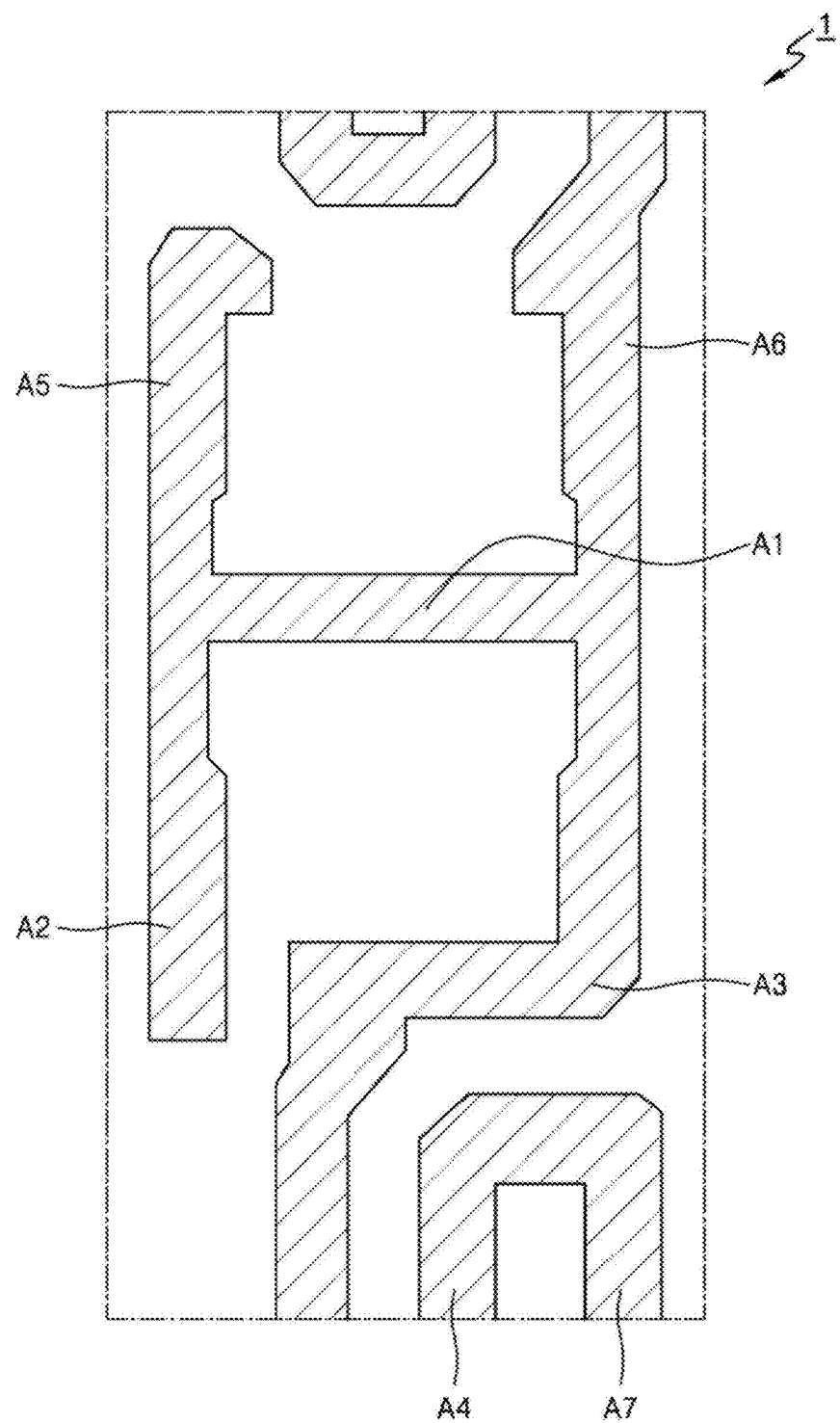
FIGS. 6 through 14 are views illustrating a method of forming a pixel of a display apparatus according to one embodiment of the present inventive concept.

Referring to FIGS. 4 and 6, the semiconductor layers A1 through A7 are formed on the buffer layer 101, which is formed on the substrate 100. The semiconductor layers A1 through A7 may include amorphous silicon, a polysilicon layer, or an oxide semiconductor, such as a (In2O3)a (Ga2O3)b(ZnO)c (G-I-Z-O) layer in which conditions of a≥0, b≥0, and c>0 are satisfied.

The first gate insulation film 102 is formed on the semiconductor layers A1 through A7. The first gate insulation film 102 is formed on the entire front surface of the substrate 100 and covers the semiconductors A1 through A7. The first gate insulation film 102 may include an organic insulation material and/or an inorganic insulation material. In one embodiment, the first gate insulation film 102 may include silicon nitride film $SiN_x$, silicon oxide film $SiO_2$, hafnium oxide, or aluminum oxide.

Figure 7:
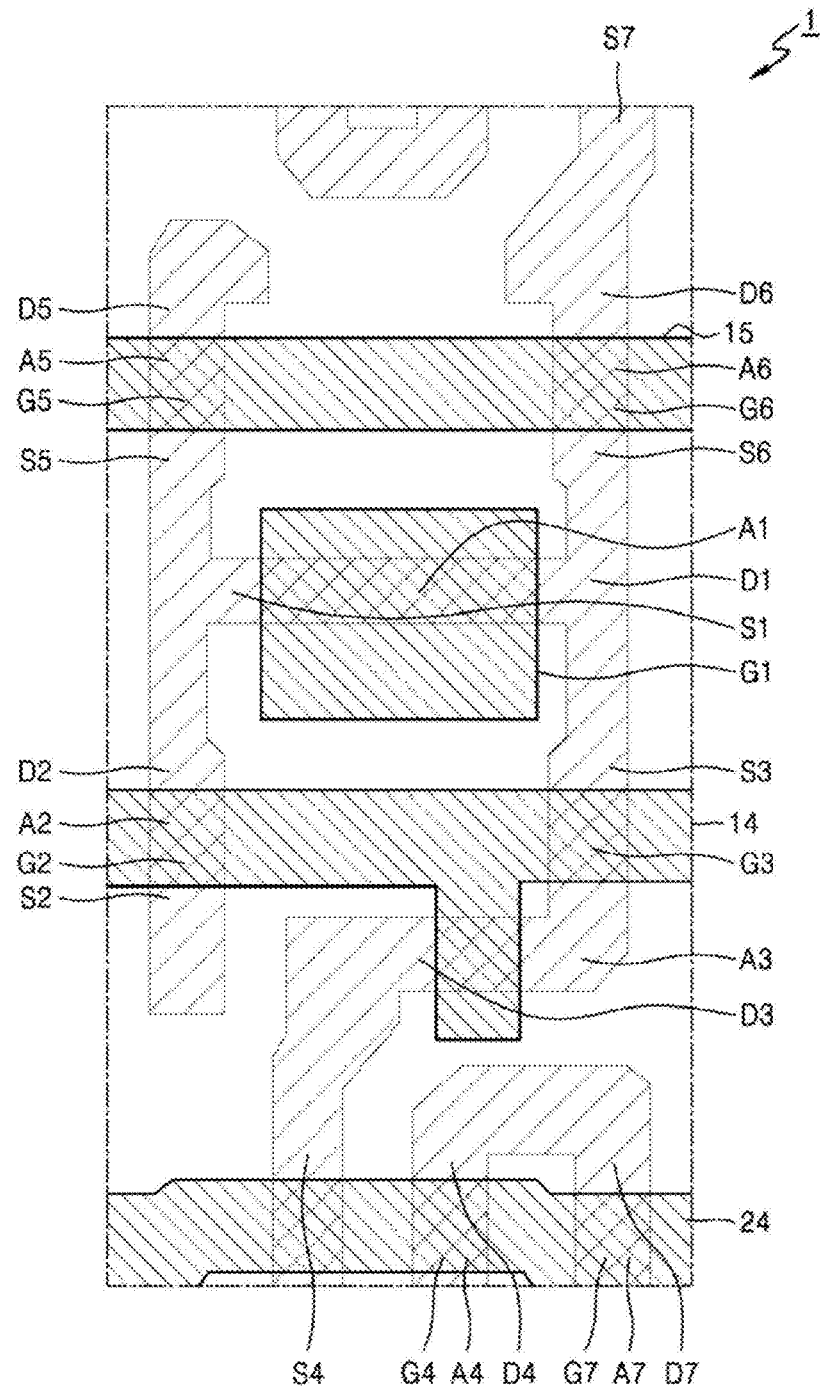

Referring to FIGS. 4 and 7, the first conductive layer including the gate electrodes G1 through G7, the first and second scan lines 14 and 24, and the light emission control line 15 is formed on the first gate insulation film 102. The gate electrodes G1 through G7, the first and second scan lines 14 and 24, and the light emission control line 15 may be disposed on the same layer and include the same material. In embodiments, the data line 16, the gate electrodes G1 through G7, the first and second scan lines 14 and 24, and the light emission control line 15 may be formed patterning an electrically conductive material layer.

The first scan line 14 may function as the compensating gate electrodes G3 of the compensating thin film transistor T3 and the data transmitting gate electrode G2 of T2. The second scan line 24 may function as the first initializing gate electrode G4 of the first initializing thin film transistor T4 and the second initializing gate electrode G7 of the second initializing thin film transistor T7. The light emission control line 15 may function as the first emission control gate electrode G5 of the first emission control thin film transistor T5 and the second emission control gate electrode G6 of the second emission control thin film transistor T6. The driving gate electrode G1 is an island type and overlaps with a channel area of the driving semiconductor layer A1 of the driving thin film transistor T1.

Thereafter, the source electrodes S1 through S7 and the drain electrodes D1 through D7 are respectively formed by injecting impurities into both ends of the semiconductor layers A1 through A7 by using the gate electrodes G1 through G7 as a mask. The impurities are different according to types of the thin film transistors and may be P-type impurities or N-type impurities.

The second gate insulation film 103 is formed on the gate electrodes G1 through G7 throughout the entire substrate 100. The second gate insulation film 103 may include an organic insulation material and/or an inorganic insulation material. In one embodiment, the second gate insulation film 103 may include silicon nitride film $SiN_x$, silicon oxide film $SiO_2$, hafnium oxide, or aluminum oxide.

Figure 8:
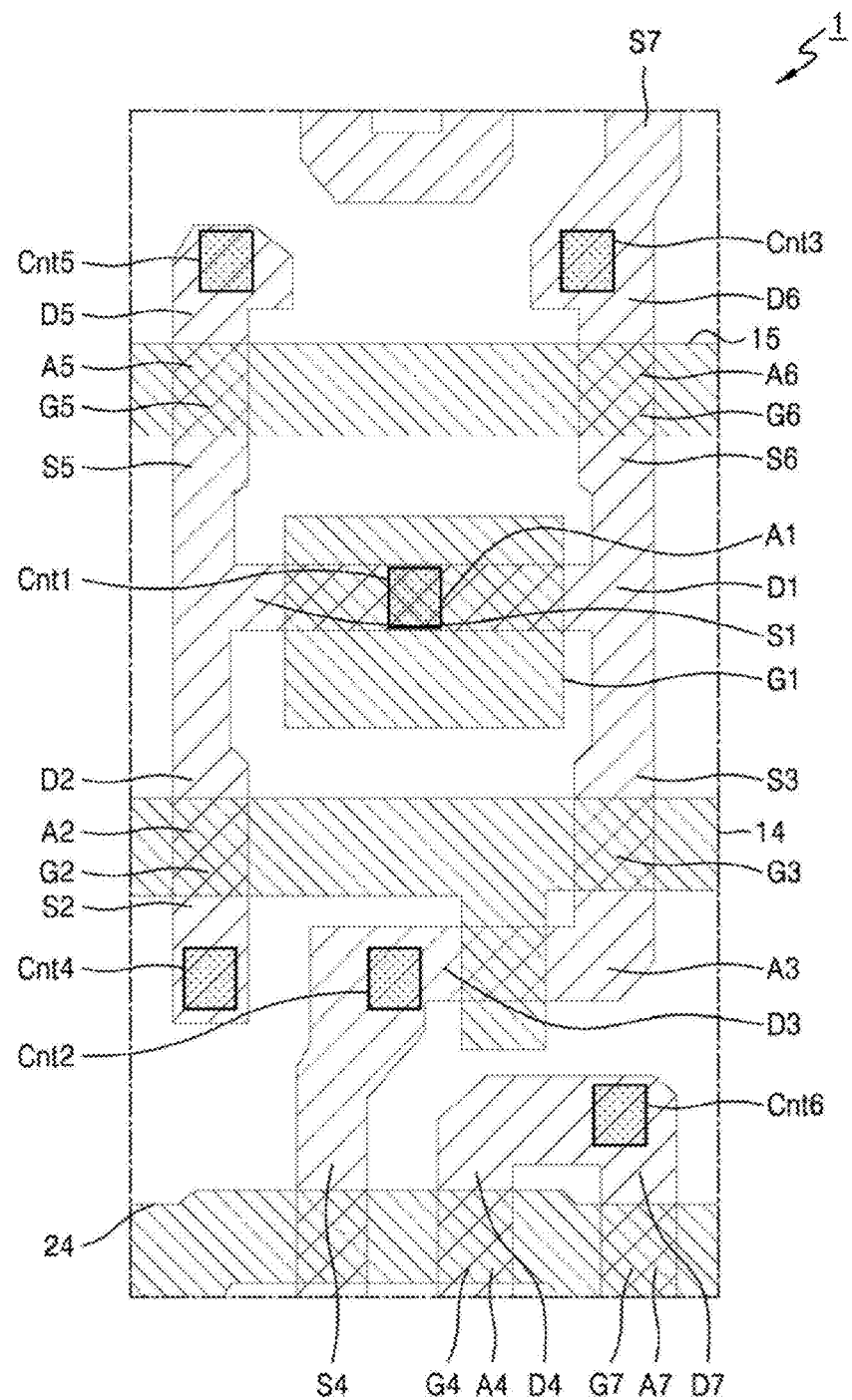

Referring to FIGS. 4 and 8, the first contact hole Cnt1 is formed to pass through the second gate insulation film 103, and the second through sixth contact holes Cnt2 through Cnt6 are formed to pass through the first and second gate insulation films 102 and 103. The first contact hole Cnt1 may expose the driving gate electrode G1, and the second through sixth contact holes Cnt2 through Cnt6 may expose portions of the corresponding semiconductor layers A2 through A6.

Figure 9:
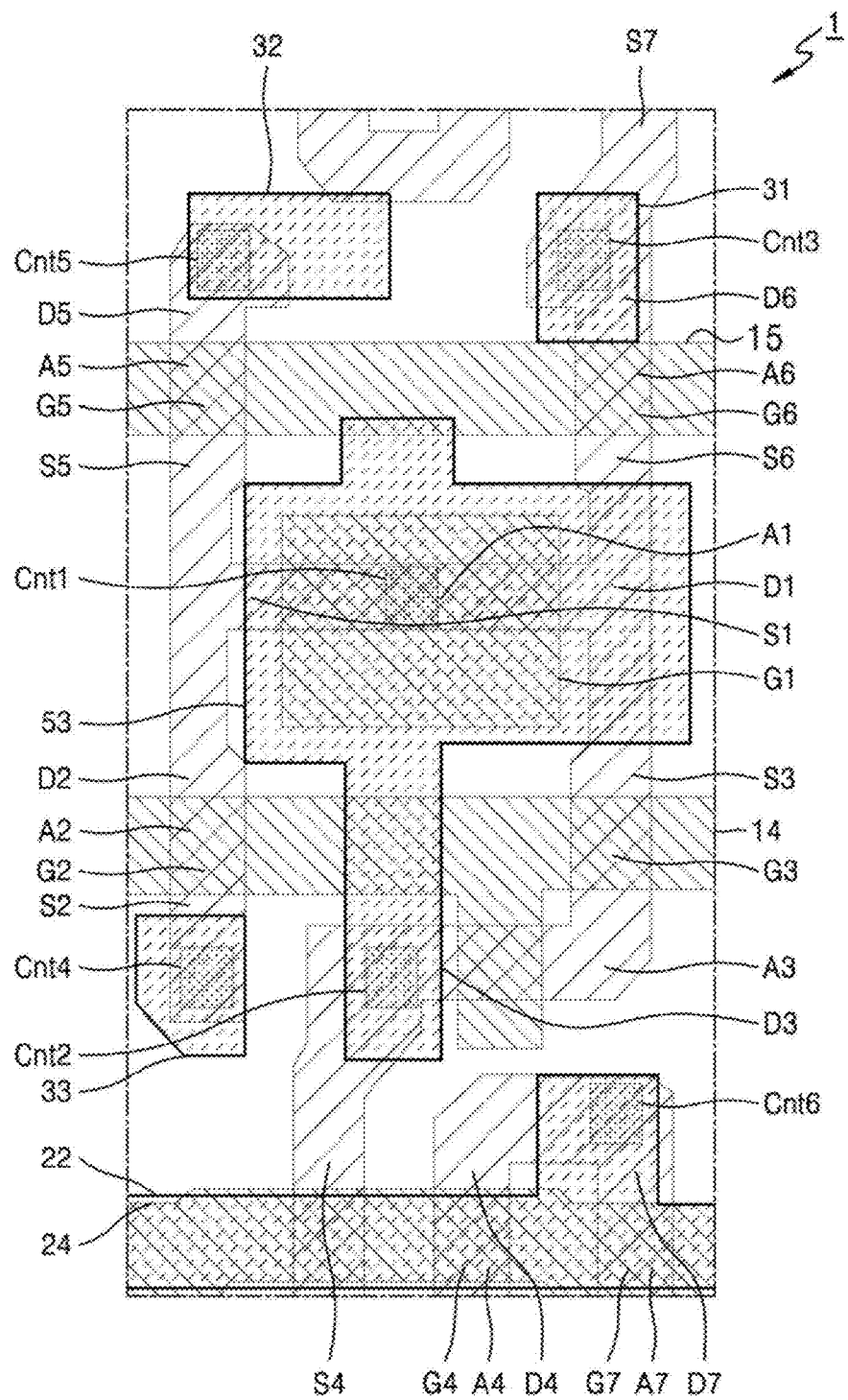

Referring to FIGS. 4 and 9, a second conductive layer is formed, and the second conductive layer includes the first intermediate electrode layer 31, the second intermediate electrode layer 32, the third intermediate electrode layer 33, the first capacitor electrode 53 of the storage capacitor Cst, and the initializing voltage line 22. The first intermediate electrode layer 31, the second intermediate electrode layer 32, the third intermediate electrode layer 33, the first capacitor electrode 53 of the storage capacitor Cst, and the initializing voltage line 22 are formed on the same layer and include the same material. In embodiments, the first intermediate electrode layer 31, the second intermediate electrode layer 32, the third intermediate electrode layer 33, the first capacitor electrode 53 of the storage capacitor Cst, and the initializing voltage line 22 are formed by patterning an electrically conductive material layer.

The first capacitor electrode 53 of the storage capacitor Cst may be disposed to overlap with the driving gate electrode G1. The first capacitor electrode 53 of the storage capacitor Cst may have a portion, which is electrically connected to the driving gate electrode G1 of the driving thin film transistor T1 through the first contact hole Cnt1, and another portion which is electrically connected to the first initializing source electrode S4 of the first initializing thin film transistor T4 through the second contact hole Cnt2.

The second intermediate electrode layer 32 contacts the first light emission control drain electrode D5 of the first light emission control thin film transistor T5 through the fifth contact hole Cnt5. The third intermediate electrode layer 33 contacts the data transmitting thin film transistor T2 through the fourth contact hole Cnt4.

Thereafter, the first interlayer insulation film 104 is formed to cover the second conductive layer including the first capacitor electrode 53 of the storage capacitor Cst. The first interlayer insulation film 104 may include an organic insulation material and/or an inorganic insulation material.

Figure 10:
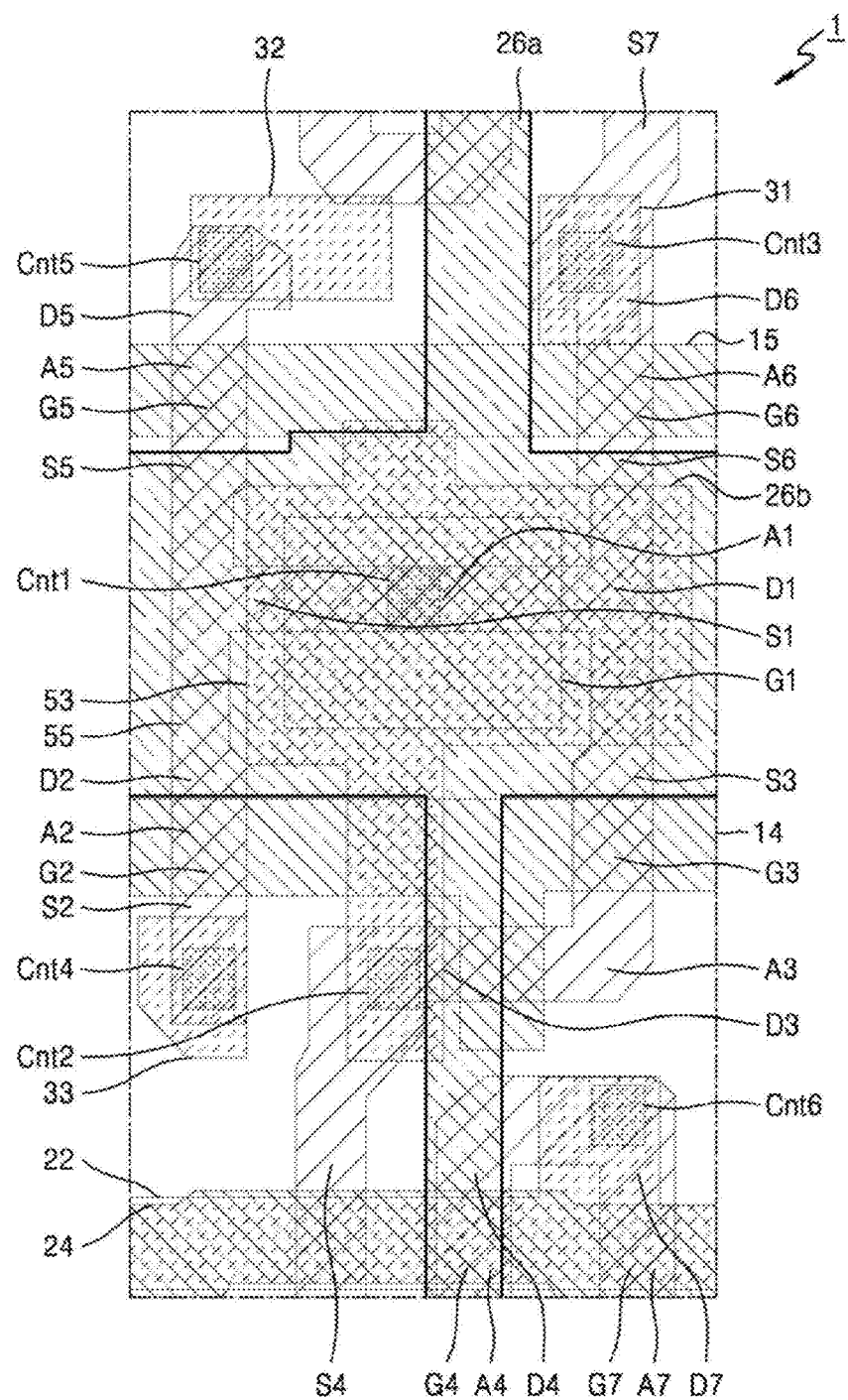

Referring to FIGS. 4 and 10, the third conductive layer is formed and includes the driving voltage line 26 and the second capacitor electrode 55 of the storage capacitor Cst. The driving voltage line 26 and the second capacitor electrode 55 of the storage capacitor Cst may be disposed on the same layer and may include the same material. In embodiments, the driving voltage line 26 and the second capacitor electrode 55 of the storage capacitor Cst may be formed patterning an electrically conductive material layer.

A portion of the driving voltage line 26 may form the second capacitor electrode 55 of the storage capacitor Cst. The driving voltage line 26 may include the first portion 26a extended along the second direction and the second portion 26b extended along the first direction. The first portion 26a and the second portion 26b may intersect and form a mesh. The second portion 26b of the driving voltage line 26 may simultaneously function as the second capacitor electrode 55 of the storage capacitor Cst.

The second capacitor electrode 55 of the storage capacitor Cst may be disposed to overlap the first capacitor electrode 53 through the first interlayer insulation film 104.

Thereafter, the second interlayer insulation film 105 is formed to cover the driving voltage line 26 and the second capacitor electrode 55 of the storage capacitor Cst. The second interlayer insulation film 105 may include an organic insulation material and/or an inorganic insulation material.

Figure 11:
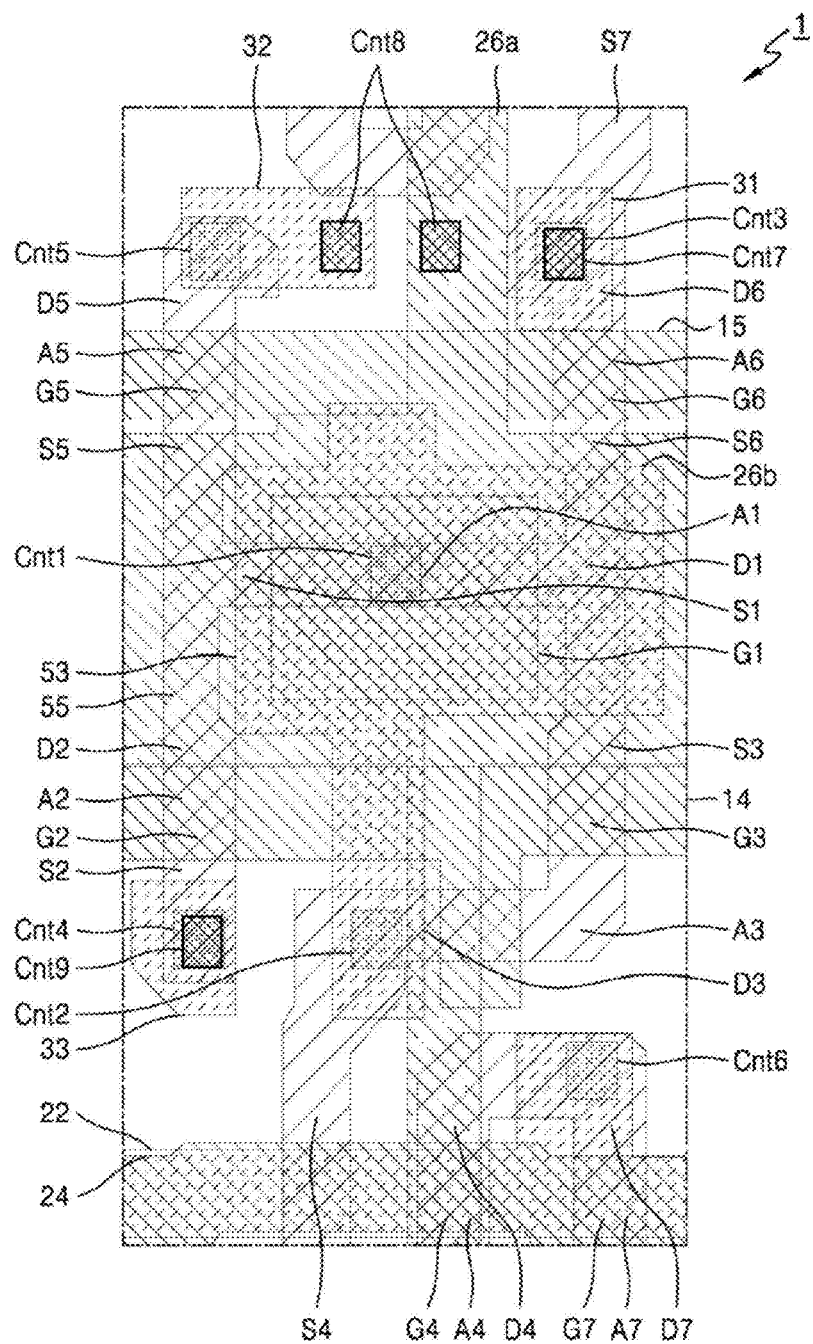

Referring to FIGS. 4 and 11, the seventh through ninth contact holes Cnt7 through Cnt9 are formed to pass through the first interlayer insulation film 104 and/or the second interlayer insulation film 105. The seventh contact hole Cnt7 exposes the first intermediate electrode layer 31, the eighth contact hole Cnt8 exposes the second intermediate electrode layer 32 and the driving voltage line 26, and the ninth contact hole Cnt9 exposes the third intermediate electrode layer 33.

Figure 12:
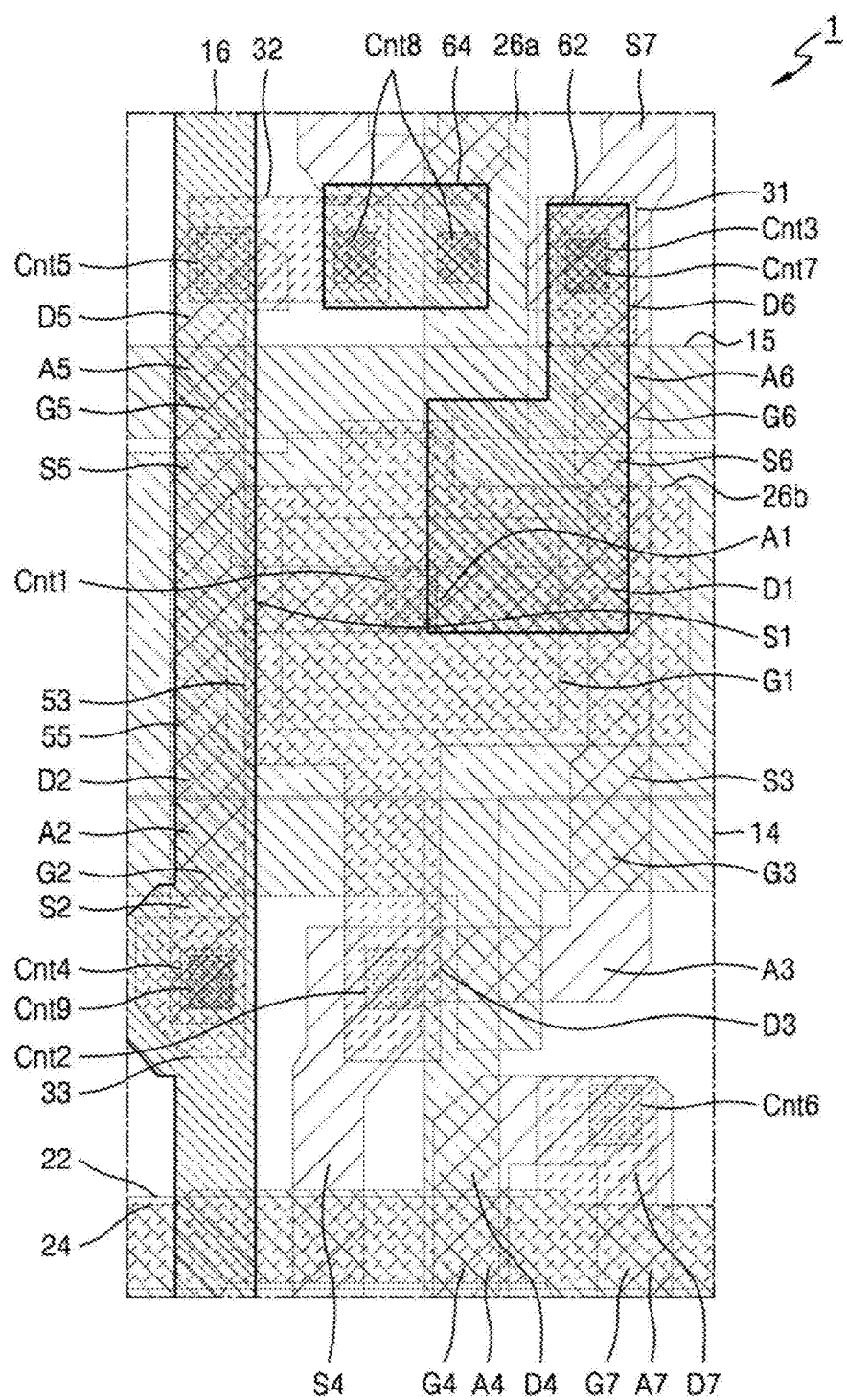

Referring to FIGS. 4 and 12, the fourth conductive layer is formed and includes the data line 16, the first connecting electrode 62, and the second connecting electrode 64. The data line 16, the first connecting electrode 62, and the second connecting electrode 64 may be disposed on the same layer and may include the same material. In embodiments, the data line 16, the first connecting electrode 62, and the second connecting electrode 64 may be formed patterning an electrically conductive material layer.

The data line 16 intersects the first and second scan lines 14 and 24, extends along the second direction, and may be disposed in each pixel 1. The data line 16 may be connected to the data transmitting source electrode S2 through the fourth and ninth contact holes Cnt4 and Cnt9 and the third intermediate electrode layer 33, and the driving voltage line 26 may be connected first light emission control source electrode S5 through the eighth contact hole Cnt8, the second intermediate electrode layer 32, and the second connecting electrode 64. The first connecting electrode 62 may be connected to the first intermediate electrode layer 31 through the seventh contact hole Cnt7, and the first intermediate electrode layer 31 may be connected to the second initializing drain electrode D7 through the third contact hole Cnt3.

Thereafter, the planarization film 106 is formed and covers the data line 16, the first connecting electrode 62, and the second connecting electrode 64. The planarization film 106 may include a single layer or a multilayer including an inorganic compound, an organic compound, and/or an inorganic/inorganic compound.

Figure 13:
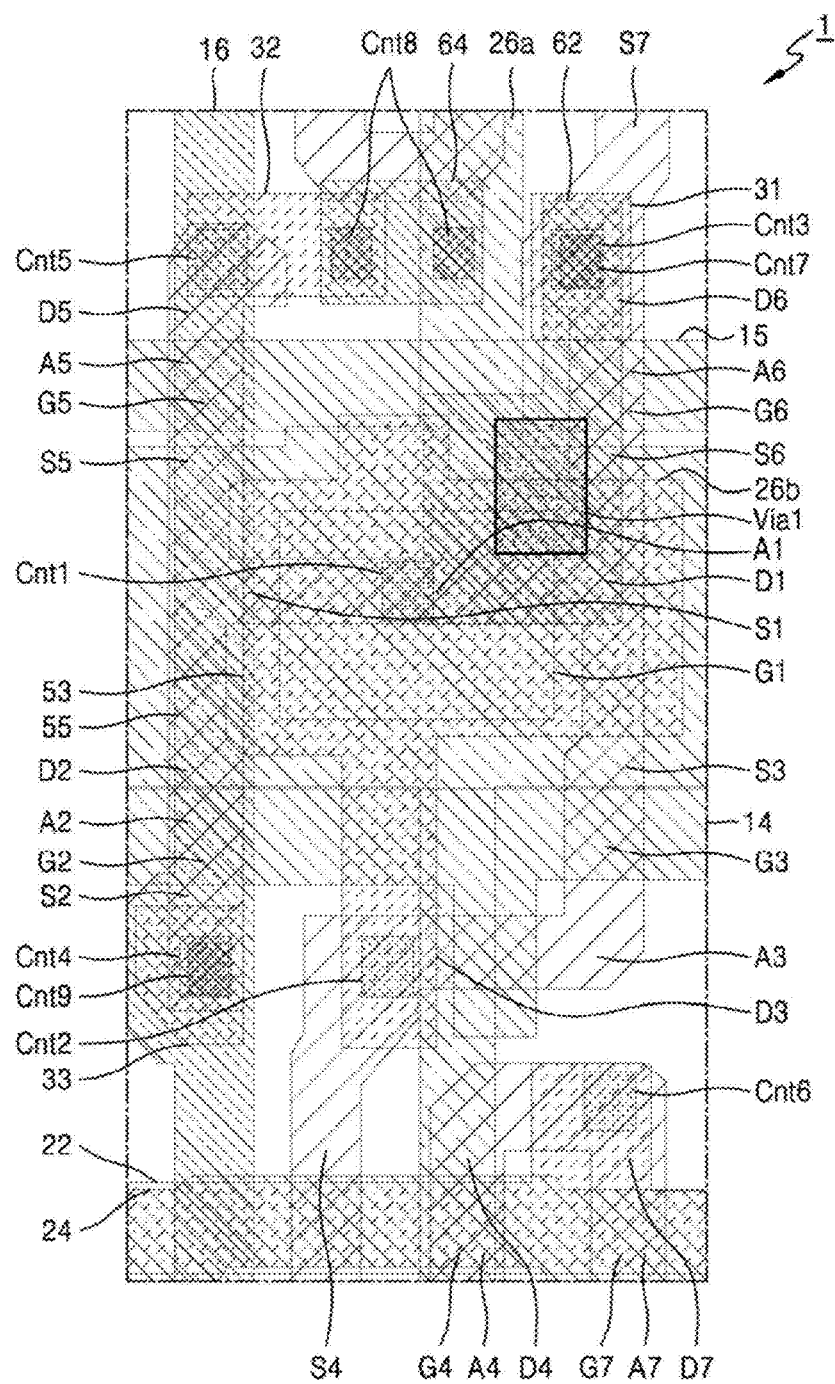

Referring to FIGS. 4 and 13, the first via hole Via1 is formed to pass through the planarization film 106. The first via hole Via1 may be disposed to be spaced apart from the third and seventh contact holes Cnt3 and Cnt7 and may expose the first connecting electrode 62.

Figure 14:
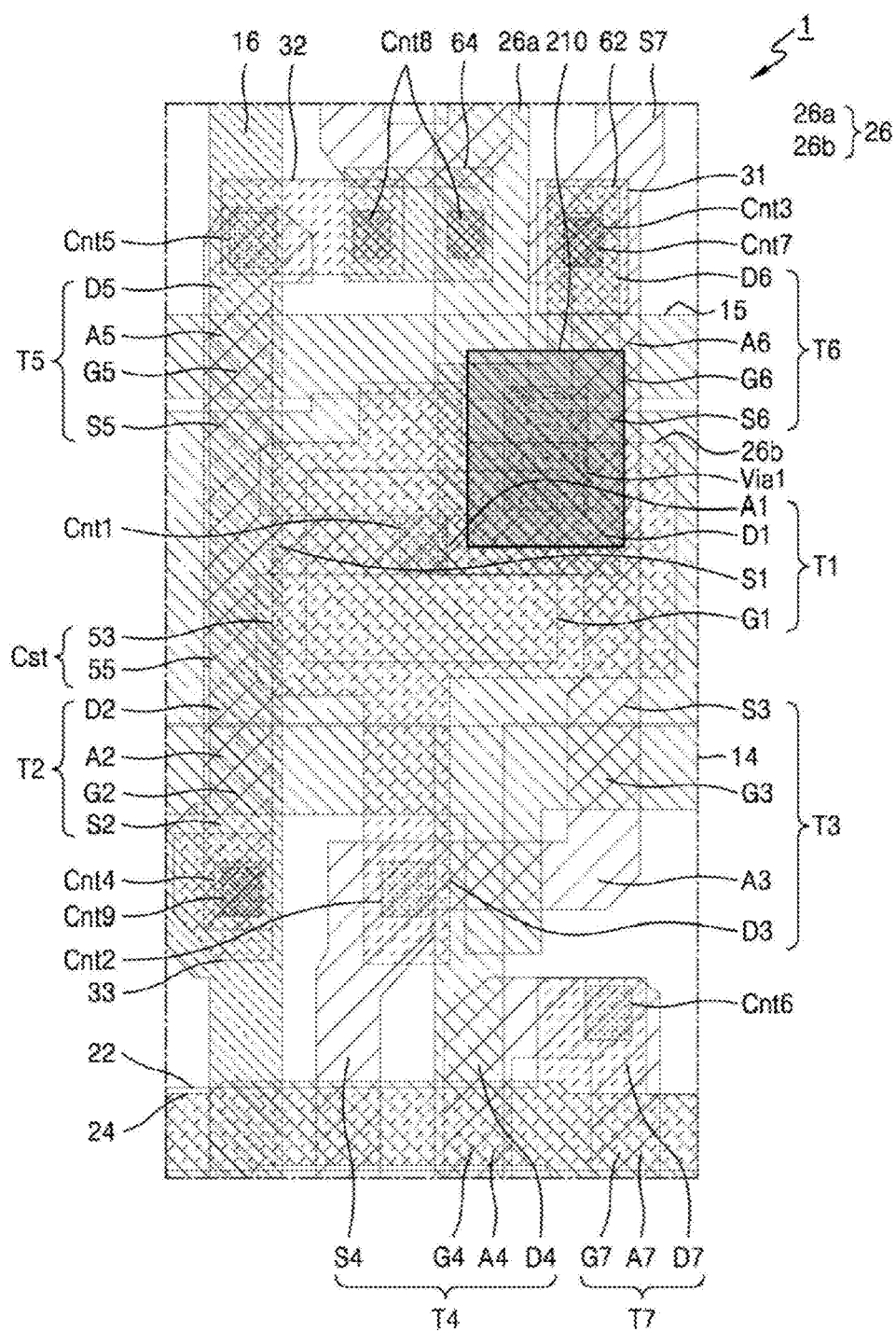

Referring to FIGS. 4 and 14, the pixel electrode 210 is formed.

The pixel electrode 210 is connected to the first connecting electrode 62 through the first via hole Via1 and is connected to the second light emission control thin film transistor T6 through cover metals, such as the first connecting electrode 62 and the first intermediate electrode layer 31. The pixel electrode 210 may be formed to overlap the driving thin film transistor T1 and at least a portion of the storage capacitor Cst.

In embodiments, a pixel defining film may be formed on the planarization film 106 and may include an opening to expose an upper side of the pixel electrode 210. An organic film including a light-emitting layer may be formed on the pixel electrode 210 which is exposed through the opening of the planarization film 106. In addition, an opposite electrode is formed to cover the entire substrate 100 including an organic film. The opposite electrode may be a common electrode.

As described above according to the present embodiments, the data line 16 and the second capacitor electrode 55 of the storage capacitor Cst are disposed on different layers to increase an area of the second capacitor electrode 55, to provide a capacitance of the storage capacitor Cst, and to realize a display apparatus having ultra-high resolution.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a plurality of pixels disposed over a substrate,
wherein each pixel comprises:
a scan line extending along a first direction;
a data line extending along a second direction which is different from the first direction;
a switching thin film transistor connected to the scan line and the data line, the switching thin film transistor comprising a switching gate electrode, a switching source electrode, and a switching drain electrode;
a driving thin film transistor connected to the switching thin film transistor, the driving thin film transistor comprising a driving gate electrode, a driving source electrode, and a driving drain electrode;
a storage capacitor connected to the driving thin film transistor, the storage capacitor comprising a first capacitor electrode, a dielectric layer, and a second capacitor electrode which are sequentially stacked;
a first insulating layer disposed on the scan line;
a second insulating layer disposed on the first capacitor electrode; and
a third insulating layer disposed on the second capacitor electrode, wherein the first capacitor electrode is disposed on the first insulating layer, wherein the second capacitor electrode is disposed on the second insulating layer, and
wherein each of the first capacitor electrode and the second capacitor electrode is disposed on a different layer from those of the scan line and the data line.

2. The display apparatus of claim 1, further comprising a driving voltage line extending along the second direction and disposed on a layer different from that of the data line.

3. The display apparatus of claim 2, wherein the driving voltage line is disposed on the same layer as that of the second capacitor electrode.

4. The display apparatus of claim 2, wherein the second capacitor electrode is a portion of the driving voltage line.

5. The display apparatus of claim 2, wherein the driving voltage line comprises a first portion extending along the second direction and a second portion extending along the first direction which intersects the first portion.

6. The display apparatus of claim 2, wherein the driving voltage line is disposed on a layer below that of the data line.

7. The display apparatus of claim 1, wherein the driving gate electrode is disposed on the same layer as that of the scan line and apart from the scan line to have an island shape when viewed in a direction perpendicular to a major surface of the substrate.

8. The display apparatus of claim 1, wherein the first capacitor electrode is disposed on a different layer from that of the driving gate electrode.

9. The display apparatus of claim 8, wherein the first capacitor electrode is connected to the switching thin film transistor through a first contact hole and is further connected to the driving gate electrode through a second contact hole.

10. The display apparatus of claim 1, wherein the second capacitor electrode is disposed on a layer below that of the data line.

11. The display apparatus of claim 1, wherein the first capacitor electrode and the second capacitor electrode are disposed on a layer between those of the scan line and the data line.

12. The display apparatus of claim 1, further comprising:
a pixel electrode connected to the switching thin film transistor; and
a first connecting electrode disposed between the switching thin film transistor and the pixel electrode.

13. The display apparatus of claim 12, wherein the first connecting electrode is disposed on the same layer as that of the data line.

14. The display apparatus of claim 12, further comprising a first intermediate electrode layer disposed between the switching thin film transistor and the first connecting electrode.

15. The display apparatus of claim 14, wherein the first intermediate electrode layer is disposed on the same layer as that of the first capacitor electrode.

16. The display apparatus of claim 14, wherein the first connecting electrode is connected to the first intermediate electrode layer through a contact hole and is further connected to the pixel electrode through a via hole, wherein the contact hole and the via hole are separate from each other.

17. A display apparatus comprising:
a plurality of pixels disposed over a substrate,
wherein each pixel comprises:
a scan line extending along a first direction;
a data line extending along a second direction which is different from the first direction;
a driving voltage line disposed along the second direction;
a switching thin film transistor comprising a switching gate electrode, a switching source electrode, and a switching drain electrode;
a driving thin film transistor comprising a driving gate electrode, a driving source electrode, and a driving drain electrode; and
a storage capacitor connected to the driving thin film transistor, the storage capacitor comprising a first capacitor electrode, a dielectric layer, and a second capacitor electrode which are sequentially stacked,
a first insulating layer disposed on the scan line;
a second insulating layer disposed on the first capacitor electrode; and
a third insulating layer disposed on the second capacitor electrode and the driving voltage line, wherein the first capacitor electrode is disposed on the first insulating layer, wherein the data line is disposed on the third insulating layer, and
wherein the driving voltage line and the data line are disposed on different layers.

18. The display apparatus of claim 17, wherein the driving voltage line comprises a first portion extending along the second direction, and a second portion extending along the first direction which intersects the second direction.

19. The display apparatus of claim 18, wherein a portion of the second portion overlaps the data line when viewed in a direction perpendicular to a major surface of the substrate.

20. The display apparatus of claim 18, wherein a portion of the second portion is the second capacitor electrode of the storage capacitor.

* * * * *